(12) United States Patent
Ma et al.

(10) Patent No.: US 7,033,183 B2
(45) Date of Patent: Apr. 25, 2006

(54) LAND GRID ARRAY CONNECTOR ASSEMBLY WITH PICK-UP CAP

(75) Inventors: Hao-Yun Ma, Tu-chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/025,473

(22) Filed: Dec. 28, 2004

(65) Prior Publication Data

US 2005/0159026 A1    Jul. 21, 2005

(30) Foreign Application Priority Data

Jan. 16, 2004    (CN)    ................. 2004200244046

(51) Int. Cl.
*H01R 13/60* (2006.01)
*H01R 13/00* (2006.01)

(52) U.S. Cl. ....................................... 439/41; 439/485

(58) Field of Classification Search .................. 439/41, 439/342, 331, 940, 135, 485
See application file for complete search history.

(56) References Cited

U.S. PATENT DOCUMENTS

| | | | | |
|---|---|---|---|---|
| 6,877,990 B1* | 4/2005 | Liao et al. | ..................... | 439/41 |
| 6,939,140 B1* | 9/2005 | Liao | ............................. | 439/41 |
| 2004/0248431 A1* | 12/2004 | Liao et al. | ..................... | 439/41 |
| 2004/0266248 A1* | 12/2004 | Liao | ............................ | 439/342 |
| 2005/0153581 A1* | 7/2005 | Ma et al. | ........................ | 439/73 |

* cited by examiner

*Primary Examiner*—Chandrika Prasad
(74) *Attorney, Agent, or Firm*—Wei Te Chung

(57) ABSTRACT

An LGA connector assembly (1) includes an LGA connector (2) and a generally rectangular pick-up cap (3) mounted onto the connector. The connector defines a number of passageways (212) for receiving a corresponding number of contacts (22). The pick-up cap has a first surface (300) engaged with a vacuum suction device and a second surface (301) opposite to the first surface, a plurality of vents (302, 303) disposed therethrough, and a plurality of recesses (310) formed adjacent to the vents on the second surface. The recess with blind cavity configuration and the vent are formed a gap-depth air vent therebetween along a direction of perpendicular to the pick-up cap, thereby permitting heated air to easily and uniformly flow therethrough during mounting the connector assembly onto a circuit board by SMT.

18 Claims, 6 Drawing Sheets

LAND GRID ARRAY CONNECTOR ASSEMBLY WITH PICK-UP CAP

BACKGROUND OF THE INVENTION

1. Field of the Invention

The present invention relates to a land grid array (LGA) connector assembly which comprises an LGA connector and a pick-up cap mounted on the LGA connector for providing a plane surface to be engaged by a vacuum suction device, whereby the LGA connector assembly can be moved onto a circuit substrate such as a printed circuit board (PCB) on which the LGA connector is to be mounted.

2. Description of the Prior Art

On many production lines, electronic components such as land grid array (LGA) connectors are accurately positioned on circuit substrates such as printed circuit boards (PCBs) by means of vacuum suction devices.

A method of mounting the electrical connector onto the PCB by SMT generally comprises a sequence of the following steps A through F:

A—Application of an adhesive film on the PCB having a plurality of metal contact pads. The application of the adhesive film may be performed by screen printing, pin transfer, or from a dispenser onto predetermined areas of the PCB.

B—Activation of the adhesive film by irradiation with actinic light in the ultraviolet (UV) or visible wavelength ranges between 200 and 600 nm, to a degree and for a period of time such that a desired initial tackiness is produced.

C—Mounting the connector with its contacts on the activated adhesive film and the metal contact pads of the PCB.

D—Curing the adhesive film at a temperature between 60~140° C.; for example, in a convection cabinet, using infrared radiant heaters or by means of the actinic radiation source used in step B if such source also produces infrared radiation.

E—Producing electrical engagement between the contacts of the connector and the corresponding metal contact pads of the PCB by soldering in a wave solder machine or in drag soldering equipment.

F—Cooling the assembly to room temperature.

In step C, the connector is accurately positioned on the PCB by a vacuum suction device. Generally, a typical connector has a plurality of holes in a flat top portion thereof. Thus the connector does not have a suitably smooth, integral top surface for engagement by a vacuum suction device. Typically, a pick-up cap is attached on the top portion of the connector to provide a required plane top surface.

Referring to FIG. 5, such a conventional LGA connector 8 typically comprises an insulative housing 80, a plurality of electrical contacts (not labeled) received in corresponding passageways (not labeled) of the housing 80, a metal stiffener 81 partly covered and reinforced the housing 80, a metal clip 82 pivotably mounted to an end of the housing 80, and a lever 83 pivotably mounted to an opposite end of the housing 80 for engaging with the clip 82. The clip 82 has a generally rectangular window (not labeled) in a middle portion thereof. Each contact has a contact portion protruding outwardly from an upper surface of the housing 80, for electrically connecting with a corresponding metal contact pad of an electronic package such as an LGA central processing unit (CPU) that is received in the LGA connector 8. Because of this configuration of the LGA connector 8, a pick-up cap 9 has to be pre-attached on a top portion of the housing 80 and sheltered almost all the passageways to prevent dirty material from falling onto the contacts. The pick-up cap 9 has a generally rectangular body 90. Typically, a plurality of latches 91 depends perpendicularly from sides of the body 90. The latches 91 snappingly engage with corresponding sidewalls of the clip 82, thereby mounting the pick-up cap 9 onto the LGA connector 8. The pick-up cap 9 has a plane top surface exposed through the window of the clip 82. A vacuum suction device (not shown) can accordingly engage on the top surface of the pick-up cap 9, in order to reliably move the LGA connector 8 and accurately position it onto the PCB.

When curing the adhesive film at high temperature in a convention cabinet using infrared radiant heaters, heat air can only flow through a few of the passageways which are not sheltered by the pick-up cap 9 to a bottom portion of the housing 80. Generally, the time needed for curing the adhesive film is short. Thus, the adhesive film is liable to cure non-uniformly. When this happens, electrical engagement between some of the contacts and the corresponding metal contact pads of the PCB may be flawed. The connector 8 may not reliably electrically connect with the PCB. Additionally, when cooling the entire assembly to room temperature, heat air can only be dissipated out through the passageways that are not sheltered by the pick-up cap 9. This increase the time need for cooling the assembly, which reduces the efficiency of mounting the connector 8 onto the PCB.

Referring to FIG. 6, to solve the above-mentioned problem, another pick-up cap 9' is provided. The pick-up cap 9' has generally rectangular vents 900' extending through the planar body 90' in a vertical direction thereof. When curing the adhesive film at high temperature in a convention cabinet using infrared radiant heaters, heated air can flow through the vents 900' and get to a bottom of the connector 8' to make the adhesive film of the contacts activated quickly. Therefore, the connector 8' can be reliably and electrically soldered onto the PCB in a short time, and the efficiency of mounting of the connector 8' onto the PCB is improved. However, a new problem appears. Because of the vents 900' in the pick-up cap 9', when heated air flow through the vents 900' into the bottom of the connector 8', heated air will be held up by corresponding inner walls of the vents 900' so that heated air can not uniformly flow into the connector 8', which makes the adhesive film of the contacts adjacent to the vents 900' activated quickly while the adhesive film of the contacts away from the vents 900' activated slowly. Thus the connector 8' may not reliably and electrically connect with the PCB in time.

Thus, there is a need to provide a new electrical connector assembly with a pick-up cap that overcomes the above-mentioned problems.

SUMMARY OF THE INVENTION

Accordingly, an object of the present invention is to provide a land grid array (LGA) connector assembly which has an LGA connector and a pick-up cap mounted onto the connector, wherein the pick-up cap is configured to facilitatingly and reliably solder the connector onto a printed circuit board (PCB).

To fulfill the above-mentioned object, an LGA connector assembly in accordance with a preferred embodiment of the present invention comprises an LGA connector and a generally rectangular pick-up cap mounted onto the connector. The connector comprises an insulative housing, a plurality contacts received therein, and a metal clip mounted on the housing. The housing defines a generally rectangular cavity for receiving an electronic package such as an LGA central processing unit (CPU) therein. A multiplicity of passageways is defined in a portion of the housing around the cavity, for receiving a corresponding number of the contacts therein. The clip is disposed on the housing to press the CPU upon the contacts. The pick-up cap has a first surface engaged with a vacuum suction device and a second surface opposite to the first surface, a plurality of vents through the first and second surfaces, and recesses formed adjacent to the vents on the second surface and not through the first surface. The vent is arranged with the recess in a manner that the vent does not overlap with the recess. The recess and the vent are formed a gap-depth air vent therebetween and provided to make heated air facilitatingly and uniformly flow into the bottom of the connector and solder the connector onto the PCB.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
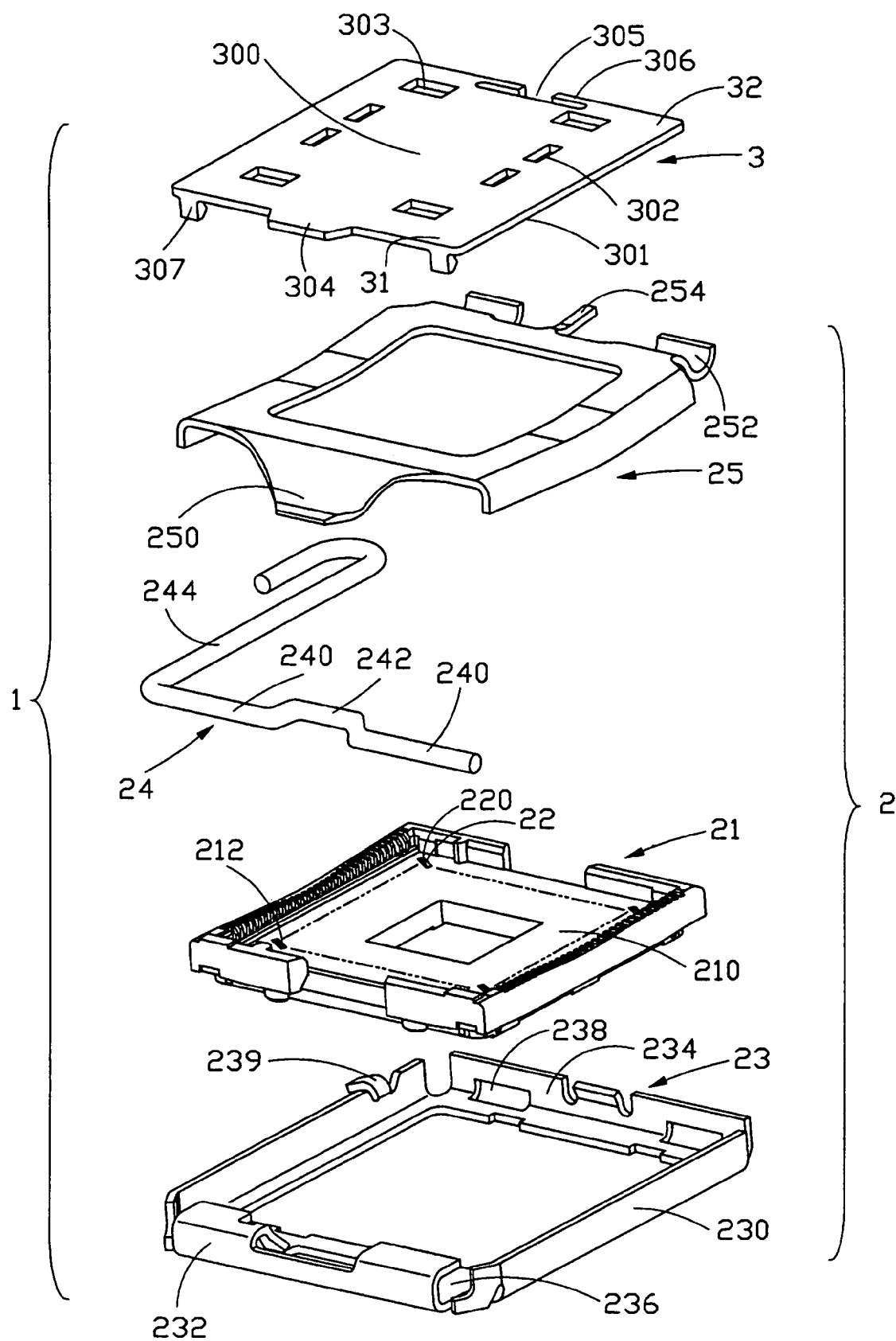
FIG. 1 is an exploded, isometric view of an LGA connector assembly of the present invention, the LGA connector assembly comprising an LGA connector and a pick-up cap mountable onto the connector.

FIG. 1 is an exploded, isometric view of a land grid array (LGA) connector assembly 1 in accordance with the preferred embodiment of the present invention. The LGA connector assembly 1 comprises an LGA connector 2 and a gengerally rectangular pick-up cap 3. The pick-up cap 3 is mounted onto the connector 2, for providing a plane surface to be engaged by a vacuum suction device (not shown). The LGA connector assembly 1 can thereby be moved onto a circuit substrate, such as a printed circuit board (PCB) (not shown), on which the connector 2 is to be mounted.

The connector 2 comprises a generally rectangular insulative housing 21, a multiplicity of contacts 22 received in the housing 21, a metal stiffener 23 partly covering and reinforcing the housing 21, a lever 24 pivotably received in an end of the stiffener 23, and a metal clip 25 pivotably mounted to an opposite end of the stiffener 23 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of passageways 212 is defined in a portion of the housing 21 under the cavity 210, the passageways 212 receiving a corresponding number of the contacts 22 therein respectively. Each contact 22 has a contacting portion 220 protruding outwardly from a top face of the cavity 210 of the housing 21, for resiliently electrically contacting a corresponding pad of the CPU.

The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23.

The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to the housing 21, the operating portion 244 engages with the ear 239.

The clip 25 defines a generally rectangular window (not labeled) in the middle thereof. The clip 25 comprises an engaging portion 250 extending arcuately from an end thereof, a pair of spaced securing portions 252 extending arcuately from an opposite end thereof and pivotably received in the slots 238 of the stiffener 23, and a tail 254 between the securing portions 252. When the clip 25 is oriented at a horizontal position parallel to the housing 21, the engaging portion 250 of the clip 25 is engaged with the actuating portion 242 of the lever 24, and the clip 25 thereby presses the CPU onto the contacts 22. When the clip 25 is oriented at a position perpendicular to the housing 21, the tail 254 abuts against the stiffener 23 to prevent the clip 25 from being over-rotated.

The pick-up cap 3 having a generally rectangular planar body (not labeled) has a first end 31, and a second end 32 opposite to the first end 31. The planar body comprises a plane first surface 300, and a second surface 301 opposite to the first surface 300. When the pick-up cap 3 is assembled with the clip 25, the second surface 301 is nearer to the clip 25 than the first surface 300, in the middle of the first surface 300 is a complete and smooth plane for providing a surface to be engaged with a vacuum suction device (not shown) and for positioning the connector assembly 1 to a desired location on the PCB. A lip 304 in a shape of trapezoid flatly extends from a middle of the first end 31, for facilitating a user operating the pick-up cap 3 during detachment of the pick-up cap 3 from the connector 2. A pair of generally rectangular first vents 302 is defined in each of opposite lateral sides of the planar body. A pair of generally rectangular second vents 303 is defined in each of the first and second ends 31, 32 of the planar body. Each of the second vents 303 is larger than each of the first vents 302. A generally T-shaped channel 305 is defined in a middle of the second end 32 of the planar body 30, thereby forming a pair of opposing arms 306.

Figure 2:
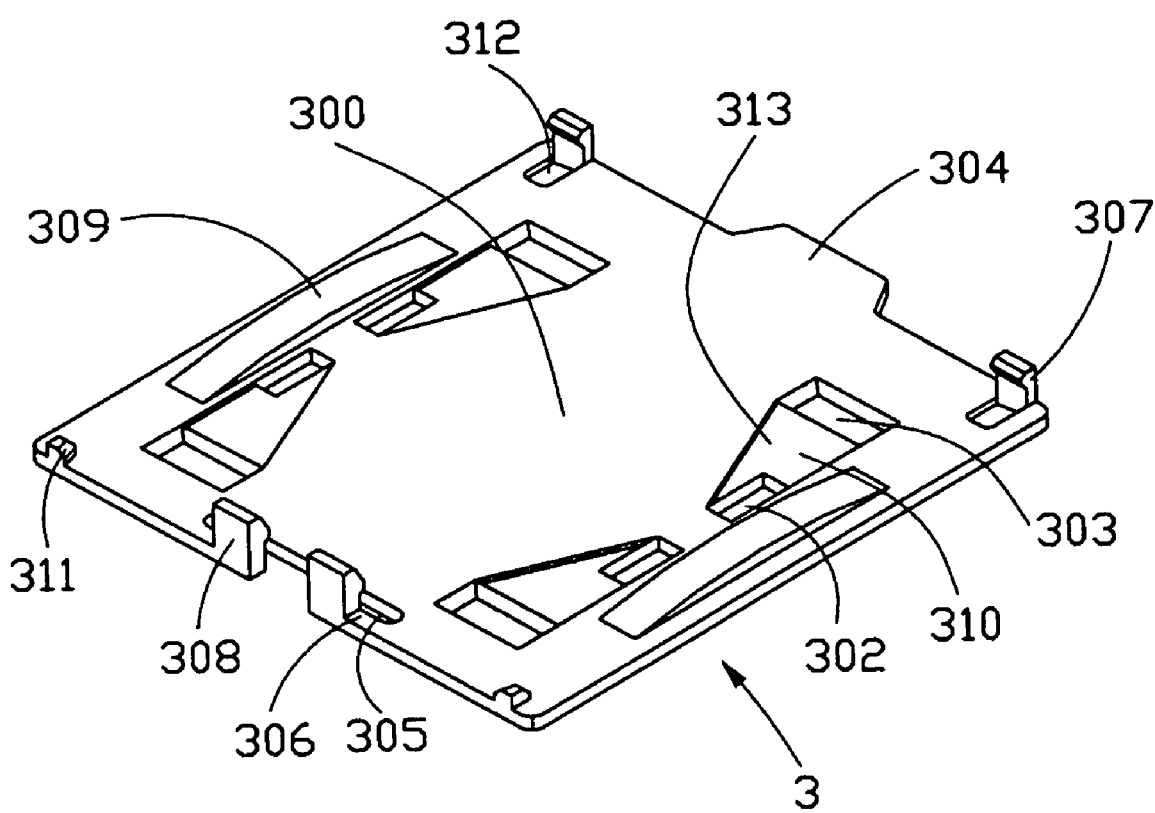
FIG. 2 is an isometric view of the pick-up cap of FIG. 1, but showing the pick-up cap inverted.

FIG. 2 is a view of the pick-up cap 3 inverted. A recess 310 is connected with the first and second vents 302, 303 and formed on the second surface 301. The recess 310 is a blind cavity configuration and defines a bottom wall 313 thereof. The first surface 300, the bottom wall 313 and the second surface 301 are formed a gap depth along a direction of the pick-up cap 3 mounted onto the connector 2 so as to a gap depth air vent formed between the vents 302, 303 and the recess 310. A pair of first clasps 307 is formed at opposite sides of the front end 31 of the planar body respectively. The first clasps 307 depend from the second surface 301 of the planar body. A hole 312 is defined in a portion of the planar body and adjacent to a rear portion of each first clasp 307, thereby increasing a resilience of the first clasp 307. A pair of second clasps 308 is formed at the second end 32 of the planar body. The second clasps 308 depend from free ends of the arms 306 respectively. A pair of protrusions 311 is formed at opposite sides of the second end 32 of the planar body respectively. The protrusions 311 depend from the second surface 301. A pair of parallel arcuate ribs 309 is formed at the opposite lateral sides of the planar body respectively. The ribs 309 depend from the second surface 301.

Figure 3:
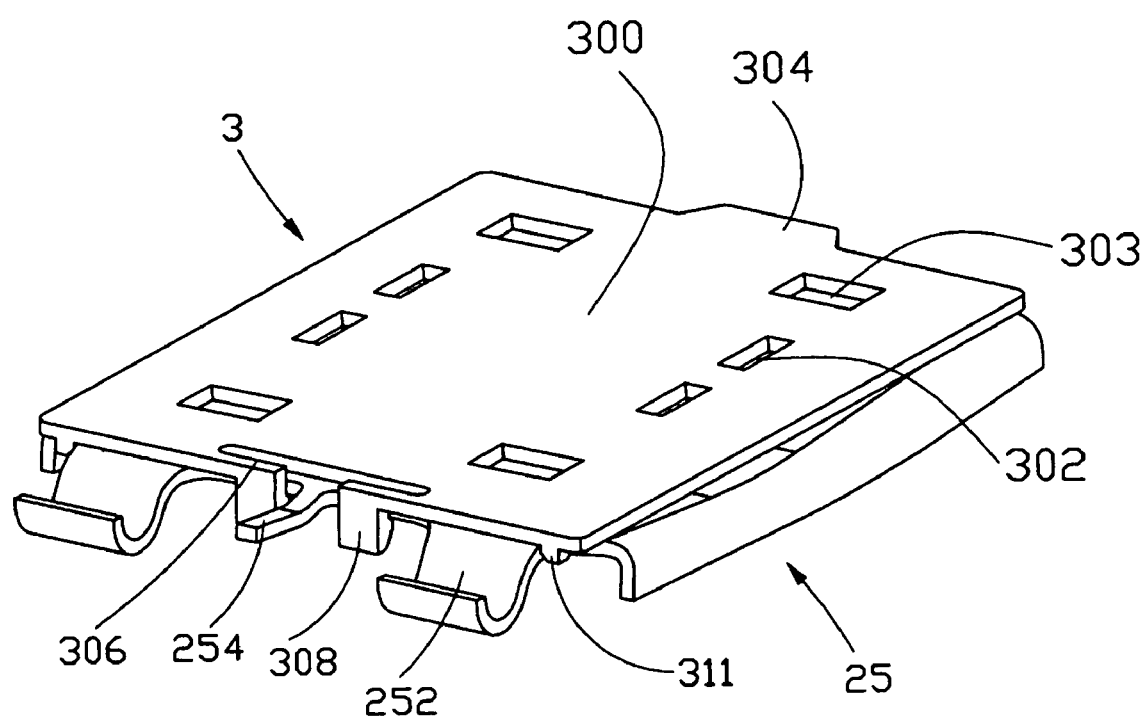
FIG. 3 is an assembly of the pick-up cap and a clip of the connector in accordance with the present invention.
Figure 4:
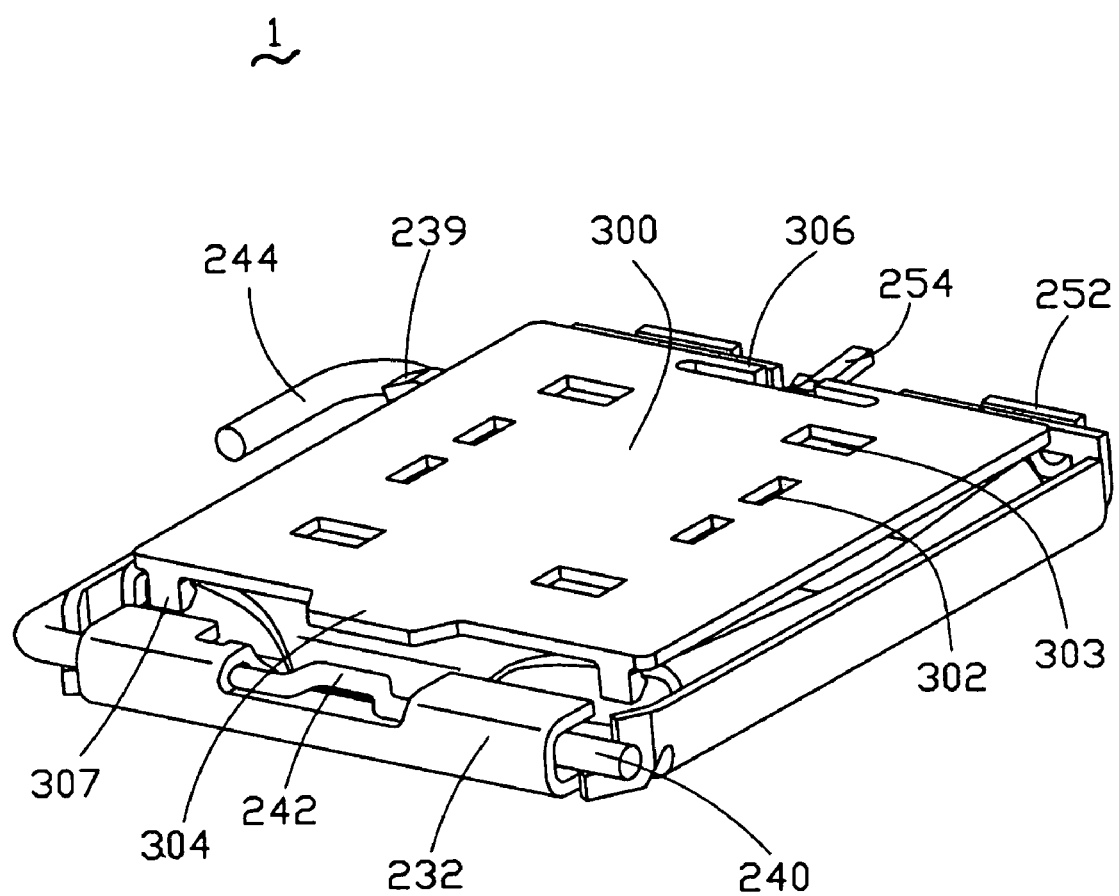
FIG. 4 is an assembled view of FIG. 1.
Figure 5:
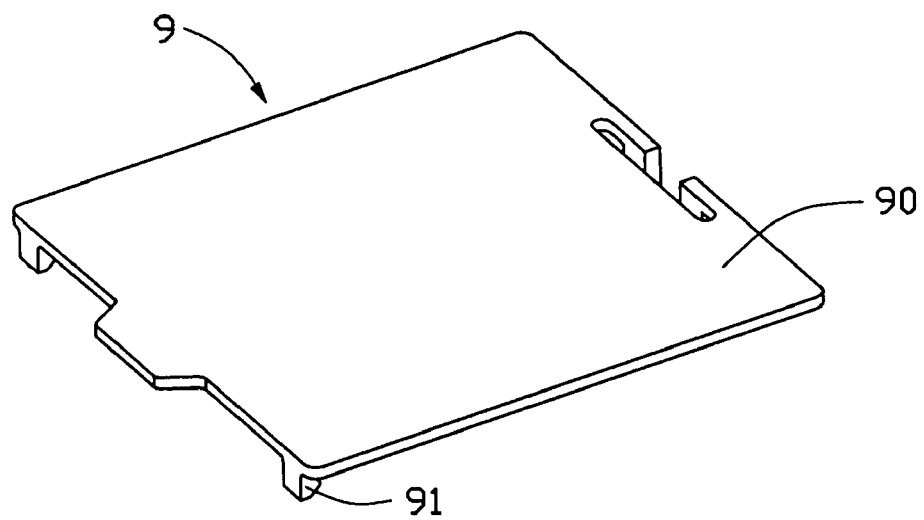
FIG. 5 is an isometric view of a conventional electrical connector assembly, the electrical connector assembly comprising an electrical connector and a pick-up cap mountable onto the connector.
Figure 5:
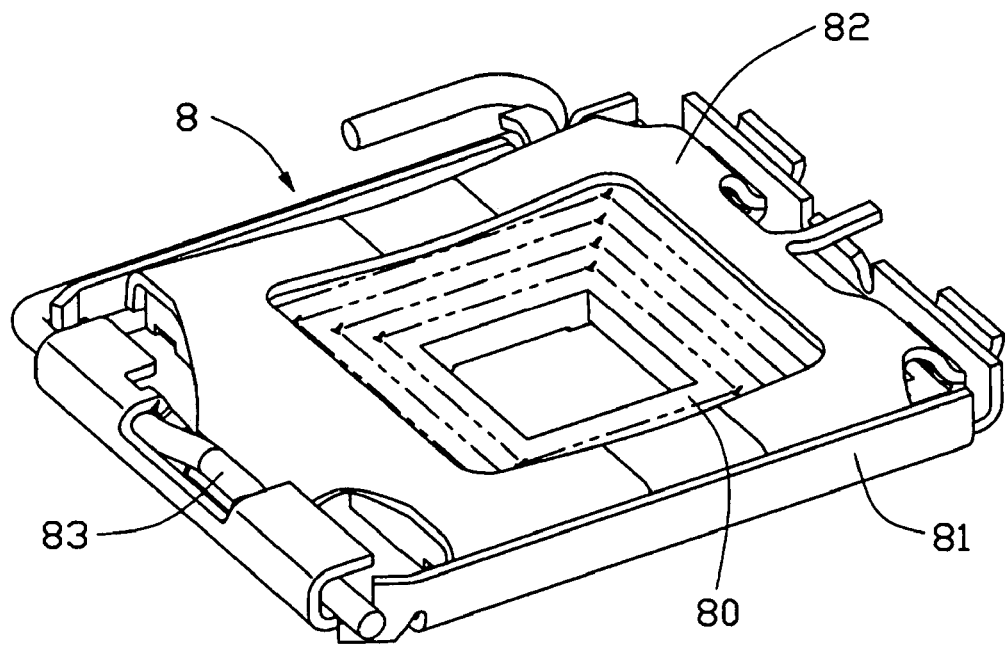
Figure 6:
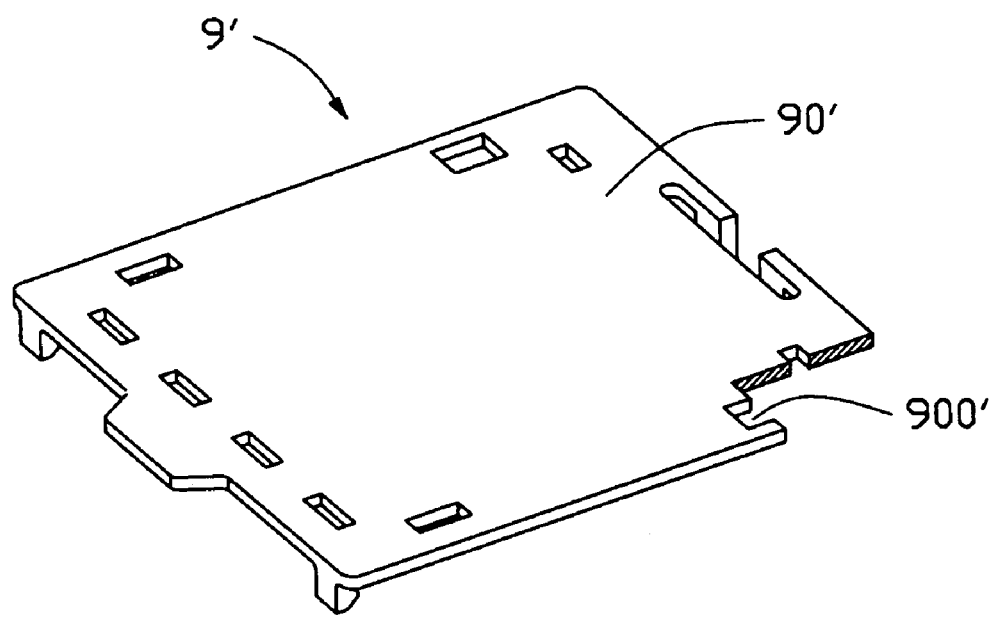
FIG. 6 is an isometric view of another conventional electrical connector assembly, the electrical connector assembly comprising an electrical connector and a pick-up cap mountable onto the connector.
Figure 6:
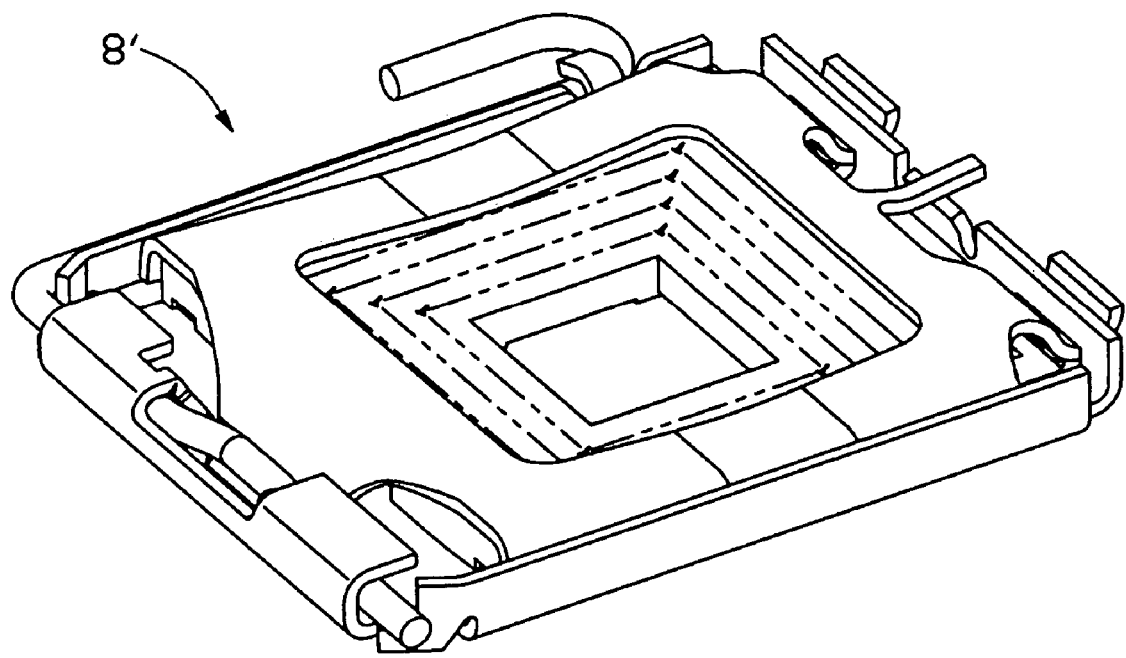

Referring to FIGS. 3 and 4, in attaching the pick-up cap 3 onto the connector 2, the pick-up cap 3 is disposed over the connector 2, with the first and second clasps 307, 308 loosely contacting corresponding edges of the clip 25 respectively. The pick-up cap 3 is pressed down. The first clasps 307 and second clasps 308 are elastically deflected outwardly. When the ribs 309 of the pick-up cap 3 contact the clip 25 and the channel 305 receives the tail 254 of the clip 25, the first and second clasps 307, 308 snappingly clasp the edges of the clip 25, and the protrusions 311 abut against the corresponding edge of the clip 25. The pick-up cap 3 is thereby securely mounted onto the connector 2. In this position, the vacuum suction device can engage the first surface 300 of the pick-up cap 3 in order to move the connector assembly 1 to the desired location on the PCB. At this time, a space is formed between the lip 304 of the pick-up cap 3 and the engaging portion 250 of the clip 25. Therefore, when the pick-up cap 3 is subsequently detached from the connector 2, the user can conveniently pull the lip 304 of the pick-up cap 3 upwardly. The first clasps 307 of the pick-up cap 3 are released from the edge of the clip 25, and then the second clasps 308 are released from the opposite edge of the clip 25. Thus the pick-up cap 3 is easily detached from the connector 2.

As will be appreciated from the foregoing description, the lip 304 of the pick-up cap 3 is integrally formed with the planar body, with the planar body and the lip 304 sharing the same first surface 300. Rather than being trapezoidal, the lip 304 may alternatively be configured to be triangular, rectangular or another suitable shape. Whatever shape the lip 304 takes, it not only facilitates detachment of the pick-up cap 3 from the connector 2, but also engagement of the pick-up cap 3 by the vacuum suction device.

When the connector assembly 1 is moved to the desired location on the PCB, with the contacts 22 of the connector 2 engaging on an activated adhesive film and metal contact pads of the PCB. The adhesive film is cured at a high temperature in a convention cabinet using infrared radiant heaters. Heated air can flow not only through the vents 302, 303 and the recesses 310 of the pick-up cap 3, but also through the window of the clip 25, and the passageways 212 of the housing 21. Thus, heated air can quickly flow to the bottom of the connector 2, and quickly and uniformly cure the adhesive film. Accordingly, when the connector assembly 1 is subsequently processed in a wave solder machine or drag soldering equipment, reliable electrical connection between the contacts 22 of the connector 2 and the metal contact pads of the PCB is produced. Furthermore, when the connector assembly 1 is cooled, heated air can be quickly disspated out through the vents 302, 303 and the recesses 310 of the pick-up cap 3, thereby the connector assembly 1 can be cooled quickly. The efficiency of mounting the connector 2 onto the PCB is thereby enhanced. Because of the gap depth air vent formed between the vents 302, 303 and the recess 310, when heated air flows into the bottom of the connector 2, heated air can quickly and uniformly flow into the bottom of the connector 2 instead of being held up by the second surface 301. So it is reliable to mounted the connector 2 onto the PCB.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A land grid array (LGA) connector assembly, comprising:
    an LGA connector comprising:
        an insulative housing defining a substantially rectangular cavity in a middle thereof, the cavity being adapted for receiving an electronic package therein;
        a plurality of electrical contacts received in the housing; and
        a metal clip disposed on the housing to press the electronic package upon the contacts; and
    a pick-up cap mounted on the clip, the pick-up cap having a first surface engagable with a vacuum suction device and a second surface opposite to the first surface, at least one vent through the first and second surfaces, and at least one recess connecting with two of the vents, the first surface, a bottom wall of the recess and the second surface forming a gap depth air vent therebetween thereby permitting heated air to quickly and uniformly flow therethrough during mounting the connector assembly onto a circuit substrate by SMT.

2. The LGA connector assembly as claimed in claim 1, wherein the pick-up cap comprises a first end and a second end opposite to the first end, and a pair of first clasps is formed at the first end and a pair of second clasps is formed at the second end.

3. The LGA connector assembly as claimed in claim 2, wherein the first clasp depends from the second surface of the pick-up cap and snappingly clasping a corresponding edge of the clip of the connector.

4. The LGA connector assembly as claimed in claim 3, wherein a hole is defined in a portion of the second end adjacent to a rear portion of the first clasp.

5. The LGA connector assembly as claimed in claim 4, wherein a T-shaped channel is defined in a middle of the second end of the pick-up cap, thereby forming a pair of opposing arms.

6. The LGA connector assembly as claimed in claim 1, wherein a pair of protrusions is formed at opposite sides of the second end of the pick-up cap respectively, the protrusions depending from the second surface and abutting against a corresponding edge of the clip.

7. The LGA connector assembly as claimed in claim 1, wherein the vent comprises a first and a second vents.

8. The LGA connector assembly as claimed in claim 7, wherein the generally rectangular first vent is defined in each of opposite lateral sides of the pick-up cap, and the generally rectangular second vent is defined in each of the first and second ends of the pick-up cap.

9. The LGA connector assembly as claimed in claim 8, wherein the second vent is larger than the first vent.

10. The LGA connector assembly as claimed in claim 1, wherein a pair of parallel arcuate ribs is formed at opposite sides of the pick-up cap, the ribs depending from the second surface of the pick-up cap.

11. The LGA connector assembly as claimed in claim 1, wherein the connector further comprises a metal stiffener partly covering and reinforcing the housing, a metallic lever pivotably received in an end of the stiffener.

12. The LGA connector assembly as claimed in claim 11, wherein comprises a pair of lateral sides each having an L-shaped cross-section, a front end having a U-shaped cross-section, and a rear end having an L-shaped cross-section.

13. The LGA connector assembly as claimed in claim 11, wherein the lever comprises a pair of locating portions pivotably received in the chamber of the stiffener, an offset actuating portion between the locating portions, and an operating portion extending perpendicularly from an end of one of the locating portions.

14. The LGA connector assembly as claimed in claim 1, wherein the clip comprises an engaging portion extending arcuately from an end thereof, a pair of spaced securing portions extending arcuately from an opposite end thereof and a tail between the securing portions.

15. A land grid array (LGA) connector assembly, comprising:
an LGA connector comprising:
an insulative housing defining a substantially rectangular cavity in a middle thereof, the cavity being adapted for receiving an electronic package therein;
a plurality of electrical contacts received in the housing; and
a metal clip disposed on the housing to press the electronic package upon the contacts; and
a pick-up cap engaged with the clip, the pick-up cap having an upward first surface adapted to be emgageable with a vacuum suction device and a downward second surface opposite to the first surface, at least one recess upwardly recessed from the second surface with thereof a bottom surface downward spaced from the first surface and located between said first surface and said second surface; wherein
at least one edge side of the recess directly joined with a space via which said edge side of the recess communicates with an exterior located above said pick-up cap, and the first surface, a bottom wall of the recess and the second surface commonly form a step-like air passage thereby permitting heated air to quickly and uniformly flow therethrough during mounting the connector assembly onto a circuit substrate via a surface mounting process.

16. The assembly as claimed in claim 15, wherein said clip defines a central opening, and said recess is essentially vertically located above said central opening and said edge side is essentially aligned with a periphery edge of said opening.

17. A land grid array (LGA) connector assembly, comprising:
an LGA connector comprising:
an insulative housing defining a substantially rectangular cavity in a middle thereof, the cavity being adapted for receiving an electronic package therein;
a plurality of electrical contacts received in the housing; and
a metal clip disposed on the housing to press the electronic package upon the contacts; and
a pick-up cap engaged with the clip, the pick-up cap having an upward first surface adapted to be emgageable with a vacuum suction device and a downward second surface opposite to the first surface, at least one vent through the first and second surfaces, and at least one recess upwardly recessed from the second surface and communicatively connecting with at least one vent, wherein the first surface, a bottom wall of the recess and the second surface commonly form a gap depth air vent therebetween thereby permitting heated air to quickly and uniformly flow therethrough during mounting the connector assembly onto a circuit substrate via a surface mounting process.

18. The assemble as claimed in claim 17, wherein said clip defines a central opening, and said recess is vertically located above said central opening while said vent is laterally offset from said central opening so as not to have said central opening vertically exposed to an exterior via said vent.

* * * * *